(12) United States Patent
Hu et al.

(10) Patent No.: US 11,610,542 B2
(45) Date of Patent: Mar. 21, 2023

(54) DISPLAY SUBSTRATE, CONTROL METHOD THEREOF AND WEARABLE DISPLAY DEVICE

(71) Applicants: Chengdu BOE Optoelectronics Technology Co., Ltd., Sichuan (CN); BOE Technology Group Co., Ltd., Beijing (CN)

(72) Inventors: Hongjin Hu, Beijing (CN); Chang Wang, Beijing (CN); Cunzhi Li, Beijing (CN); Mingqiang Wang, Beijing (CN); Xin Bi, Beijing (CN); Bin Zhang, Beijing (CN); Kun Zuo, Beijing (CN); Jiaxiang Zhang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/505,652

(22) Filed: Oct. 20, 2021

(65) Prior Publication Data
US 2022/0293048 A1 Sep. 15, 2022

(30) Foreign Application Priority Data
Mar. 12, 2021 (CN) .......................... 202110272134.9

(51) Int. Cl.
*G09G 3/36* (2006.01)
*G09G 3/3208* (2016.01)
*H01L 27/32* (2006.01)

(52) U.S. Cl.
CPC ........ *G09G 3/3208* (2013.01); *H01L 27/3211* (2013.01); *H01L 27/3276* (2013.01); *G09G 2310/0286* (2013.01)

(58) Field of Classification Search
CPC ............... G09G 3/3233; G09G 3/3266; G09G 2310/08; G09G 2320/0233;
(Continued)

(56) References Cited

U.S. PATENT DOCUMENTS

| 7,868,861 B2 * | 1/2011 | Cho ..................... G09G 3/3648 345/694 |
| 2011/0234655 A1 * | 9/2011 | Tzeng .................. G09G 3/3677 345/698 |

(Continued)

FOREIGN PATENT DOCUMENTS

| CN | 101216650 A | 7/2008 |
| CN | 101221337 A | 7/2008 |

(Continued)

OTHER PUBLICATIONS

Office Action dated Nov. 18, 2021 for Chinese Patent Application No. 202110272134.9 and English Translation.

*Primary Examiner* — Duc Q Dinh
(74) *Attorney, Agent, or Firm* — Ling Wu; Stephen Yang; Ling and Yang Intellectual Property

(57) ABSTRACT

Proposed are a display substrate, a control method thereof and a wearable display device. The display substrate includes M rows and N columns of pixels and 2M rows of scanning lines, a first sub-pixel and a second sub-pixel of pixels in an i-th row are connected to the same scanning line and electrically connected to one of a (2i−1)-th row of scanning line and a 2i-th row of scanning line, and a third sub-pixel of the pixels in the i-th row is electrically connected to the other of the (2i−1)-th row of scanning line and the 2i-th row of scanning line; when the display substrate is displaying, a first sub-pixel, a second sub-pixel and a third sub-pixel among two pixels located in a (2i−1)-th row, a j-th column, and a 2i-th row, a j-th column emit light at an i-th stage of each frame.

19 Claims, 12 Drawing Sheets

(58) Field of Classification Search
CPC ..... G09G 2320/0252; G09G 2330/021; G09G 2300/0443; G09G 2320/0209; G09G 2320/0247; G09G 3/3208; G09G 2310/0286; G09G 2300/0426; G09G 2310/0205; G09G 2320/0257; G09G 2300/0452; G09G 2310/021; G09G 2310/0272; G09G 3/2074; H01L 27/3211; H01L 27/3276; H01L 27/14636; H01L 27/3248; H01L 29/78645; H01L 27/3216; G06F 3/0445
See application file for complete search history.

(56) References Cited

U.S. PATENT DOCUMENTS

| | | | |
|---|---|---|---|
| 2012/0169687 A1* | 7/2012 | Huang | G09G 3/3677 345/94 |
| 2015/0339972 A1 | 11/2015 | Xu | |
| 2017/0123581 A1* | 5/2017 | Yang | G06F 3/04166 |
| 2017/0132965 A1 | 5/2017 | Hsu | |
| 2017/0270868 A1 | 9/2017 | Li et al. | |
| 2018/0039114 A1 | 2/2018 | Xu | |
| 2018/0315382 A1 | 11/2018 | Wang | |
| 2019/0164478 A1 | 5/2019 | Kim et al. | |
| 2021/0201816 A1* | 7/2021 | Kim | G09G 3/3266 |

FOREIGN PATENT DOCUMENTS

| | | |
|---|---|---|
| CN | 103855192 A | 6/2014 |
| CN | 104835451 A | 8/2015 |
| CN | 105511184 A | 4/2016 |
| CN | 106024829 A | 10/2016 |
| CN | 106531767 A | 3/2017 |
| CN | 106683635 A | 5/2017 |
| CN | 110208995 A | 9/2019 |
| KR | 10-2019-0061356 A | 6/2019 |

* cited by examiner

DISPLAY SUBSTRATE, CONTROL METHOD THEREOF AND WEARABLE DISPLAY DEVICE

CROSS-REFERENCE TO RELATED APPLICATION

The present application claims priority of Chinese Patent Application No. 202110272134.9 filed to the CNIPA on Mar. 12, 2021, the content of which is incorporated herein by reference.

TECHNICAL FIELD

Embodiments of the present disclosure relate to, but are not limited to, the field of display technology, and particularly relate to a display substrate and a control method thereof, a wearable display device.

BACKGROUND

An Organic Light-Emitting Diode (OLED) display apparatus has advantages of self-luminescence, fast response, wide viewing angle, high brightness, bright color, thinness, etc., compared with a Liquid Crystal Display (LCD) display apparatus, and is considered as a next generation of display technology.

With the development of electronic technology and intelligent technology, more and more wearable OLED display devices appear in people's lives. In wearable OLED display devices, people often get the corresponding time or exercise mileage information by lifting their wrists slightly and squinting at a display screen.

SUMMARY

The following is a summary of the subject matters described in the present disclosure in detail. The summary is not intended to limit the scope of protection of the claims.

In a first aspect, the present disclosure provides a display substrate including: M rows and N columns of pixels and 2M scanning lines, the scanning lines extend along a first direction, and pixels in an i-th row are electrically connected to a (2i−1)-th scanning line and a 2i-th scanning line respectively, and each pixel includes a first sub-pixel, a second sub-pixel and a third sub-pixel arranged along the first direction; the first sub-pixel and the second sub-pixel are sub-pixels of different colors and are one of a red sub-pixel and a green sub-pixel, and the third sub-pixel is a blue sub-pixel;

the first sub-pixel and the second sub-pixel of the pixels in the i-th row are connected to the same scanning line and electrically connected to one of the (2i−1)-th scanning line and the 2i-th scanning line, and the third sub-pixel of the pixels in the i-th row is electrically connected to the other of the (2i−1)-th scanning line and the 2i-th scanning line; and a display period of a picture displayed by the display substrate is N frames, and each frame of display picture includes N stages, when the display substrate is displaying, a first sub-pixel, a second sub-pixel and a third sub-pixel among two pixels located in a (2i−1)-th row, a j-th column, and a 2i-th row, a j-th column emit light at an i-th stage of each frame; the first sub-pixel, the second sub-pixel and the third sub-pixel among two pixels located in the (2i−1)-th row, the j-th column, and the 2i-th row, the j-th column which emit light at an i-th stage of an adjacent frame are all different, j=1, 2, . . . , N, 1≤i≤M/2, N is an even number, N≥1.

In some exemplary embodiments, the (2i−1)-th scanning line and the 2i-th scanning line are located at both sides of the pixels in the i-th row, respectively.

In some exemplary embodiments, a voltage value of a first scanning signal is greater than a voltage value of a second scanning signal, when the first sub-pixel and the second sub-pixel of the pixels in the i-th row are electrically connected to the (2i−1)-th scanning line, and the third sub-pixel of the pixels in the i-th row is electrically connected to the 2i-th scanning line;

the first scanning signal is a signal that makes sub-pixels connected to the (2i−1)-th scanning line emit light, and the second scanning signal is a signal that makes sub-pixels connected to the 2i-th scanning line emit light.

In some exemplary embodiments, a refresh frequency of the first scanning signal is greater than a refresh frequency of the second scanning signal.

In some exemplary embodiments, a voltage value of a first scanning signal is smaller than a voltage value of a second scanning signal, when the first sub-pixel and the second sub-pixel of the pixels in the i-th row are electrically connected to the 2i-th scanning line, and the third sub-pixel of the pixels in the i-th row is electrically connected to the (2i−1)-th scanning line; and the first scanning signal is a signal that makes sub-pixels connected to the (2i−1)-th scanning line emit light, and the second scanning signal is a signal that makes sub-pixels connected to the 2i-th scanning line emit light.

In some exemplary embodiments, a refresh frequency of the first scanning signal is smaller than a refresh frequency of the second scanning signal.

In some exemplary embodiments, the display substrate further includes a gate driving circuit and a processor; the gate driving circuit includes 2M shift registers which correspond to the 2M scanning lines one by one and are electrically connected to corresponding scanning lines; and the processor is electrically connected to the 2M shift registers, and configured to control the shift registers to provide signals to the corresponding scanning lines, so that when the display substrate is displaying, the first sub-pixel, the second sub-pixel and the third sub-pixel among two pixels located in the (2i−1)-th row, the j-th column, and the 2i-th row, the j-th column emit light at the i-th stage of each frame; the first sub-pixel, the second sub-pixel and the third sub-pixel among two pixels located in the (2i−1)-th row, the j-th column, and the 2i-th row, the j-th column which emit light at the i-th stage of the adjacent frame are all different.

In a second aspect, the present disclosure also provides a wearable display device, including any of the above display substrates.

In a third aspect, the present disclosure also provides a control method of a display substrate, configured to control any of the above display substrates, and including:

providing signals to the scanning lines, so that when the display substrate is displaying, the first sub-pixel, the second sub-pixel and the third sub-pixel among two pixels located in the (2i−1)-th row, the j-th column, and the 2i-th row, the j-th column emit light at the i-th stage of each frame; the first sub-pixel, the second sub-pixel and the third sub-pixel among two pixels located in the (2i−1)-th row, the j-th column, and the 2i-th row, the j-th column which emit light at the i-th stage of the adjacent frame are all different.

In some exemplary embodiments, at an i-th stage of an odd frame, a valid level signal is provided to a (4i−3)-th scanning line and a 4i-th scanning line, and an invalid level signal is provided to a (4i−2)-th scanning line and a (4i−1)-th scanning line, and at an i-th stage of an even frame, the valid level signal is provided to the (4i−2)-th scanning line and the (4i−1)-th scanning line, and the invalid level signal is provided to the (4i−3)-th scanning line and the 4i-th scanning line; and wherein, the valid level signal refers to a signal that makes sub-pixels connected to the scanning lines emit light, and the invalid level signal refers to a signal that makes sub-pixels connected to the scanning lines not emit light.

In some exemplary embodiments, at an i-th stage of an odd frame, a valid level signal is provided to a (4i−3)-th scanning line and a (4i−2)-th scanning line, and an invalid level signal is provided to a (4i−1)-th scanning line and a 4i-th scanning line, and at an i-th stage of an even frame, the valid level signal is provided to the (4i−1)-th scanning line and the 4i-th scanning line, and the invalid level signal is provided to the (4i−3)-th scanning line and the (4i−2)-th scanning line; and wherein, the valid level signal refers to a signal that makes sub-pixels connected to the scanning lines emit light, and the invalid level signal refers to a signal that makes sub-pixels connected to the scanning lines not emit light.

In some exemplary embodiments, when the first sub-pixel and the second sub-pixel of pixels in the i-th row are electrically connected to the (2i−1)-th scanning line and the third sub-pixel of the pixels in the i-th row is electrically connected to the 2i-th scanning line, at the i-th stage of the odd frame, a voltage value of the valid level signal provided to the (4i−3)-th scanning line is greater than a voltage value of the valid level signal provided to the 4i-th scanning line, and a refresh frequency of the valid level signal provided to the (4i−3)-th scanning line is greater than a refresh frequency of the valid level signal provided to the 4i-th scanning line; and at the i-th stage of the even frame, a voltage value of the valid level signal provided to the (4i−2)-th scanning line is smaller than that a voltage value of the valid level signal provided to the (4i−1)-th scanning line, and a refresh frequency of the valid level signal provided to the (4i−2)-th scanning line is smaller than a refresh frequency of the valid level signal provided to the (4i−1)-th scanning line.

In some exemplary embodiments, when the first sub-pixel and the second sub-pixel of pixels in the i-th row are electrically connected to the 2i-th scanning line and the third sub-pixel of the pixels in the i-th row is electrically connected to the (2i−1)-th scanning line, at the i-th stage of the odd frame, a voltage value of the valid level signal provided to the (4i−3)-th scanning line is smaller than a voltage value of the valid level signal provided to the 4i-th scanning line, and a refresh frequency of the valid level signal provided to the (4i−3)-th scanning line is smaller than a refresh frequency of the valid level signal provided to the 4i-th scanning line; and at the i-th stage of the even frame, a voltage value of the valid level signal provided to the (4i−2)-th scanning line is greater than that a voltage value of the valid level signal provided to the (4i−1)-th scanning line, and a refresh frequency of the valid level signal provided to the (4i−2)-th scanning line is greater than a refresh frequency of the valid level signal provided to the (4i−1)-th scanning line.

In some exemplary embodiments, when the first sub-pixel and the second sub-pixel of pixels in the i-th row are electrically connected to the (2i−1)-th scanning line and the third sub-pixel of the pixels in the i-th row is electrically connected to the 2i-th scanning line, at the i-th stage of the odd frame, a voltage value of the valid level signal provided to the (4i−3)-th scanning line is greater than a voltage value of the valid level signal provided to the (4i−2)-th scanning line, and a refresh frequency of the valid level signal provided to the (4i−3)-th scanning line is greater than a refresh frequency of the valid level signal provided to the (4i−2)-th scanning line; and at the i-th stage of the even frame, a voltage value of the valid level signal provided to the (4i−1)-th scanning line is greater than that a voltage value of the valid level signal provided to the 4i-th scanning line, and a refresh frequency of the valid level signal provided to the (4i−1)-th scanning line is greater than a refresh frequency of the valid level signal provided to the 4i-th scanning line.

In some exemplary embodiments, when the first sub-pixel and the second sub-pixel of pixels in the i-th row are electrically connected to the 2i-th scanning line and the third sub-pixel of the pixels in the i-th row is electrically connected to the (2i−1)-th scanning line, at the i-th stage of the odd frame, a voltage value of the valid level signal provided to the (4i−3)-th scanning line is smaller than a voltage value of the valid level signal provided to the (4i−2)-th scanning line, and a refresh frequency of the valid level signal provided to the (4i−3)-th scanning line is smaller than a refresh frequency of the valid level signal provided to the (4i−2)-th scanning line; and at the i-th stage of the even frame, a voltage value of the valid level signal provided to the (4i−1)-th scanning line is smaller than that a voltage value of the valid level signal provided to the 4i-th scanning line, and a refresh frequency of the valid level signal provided to the (4i−1)-th scanning line is smaller than a refresh frequency of the valid level signal provided to the 4i-th scanning line.

Other features and advantages of the present disclosure will be described in the subsequent description, and, in part, become apparent from the description, or can be understood by implementing the present disclosure. Other advantages of the present disclosure can be implemented and achieved by the solutions described in the specification and accompanying drawings.

Other aspects may be comprehended upon reading and understanding of the drawings and the detailed descriptions.

BRIEF DESCRIPTION OF DRAWINGS

The drawings are used to provide an understanding of technical solutions of the present disclosure, form a part of the specification, and are used to explain, together with the embodiments of the present disclosure, the technical solutions of the present disclosure and are not intended to form limitations on the technical solutions of the present disclosure.

DETAILED DESCRIPTION

Figure 1:
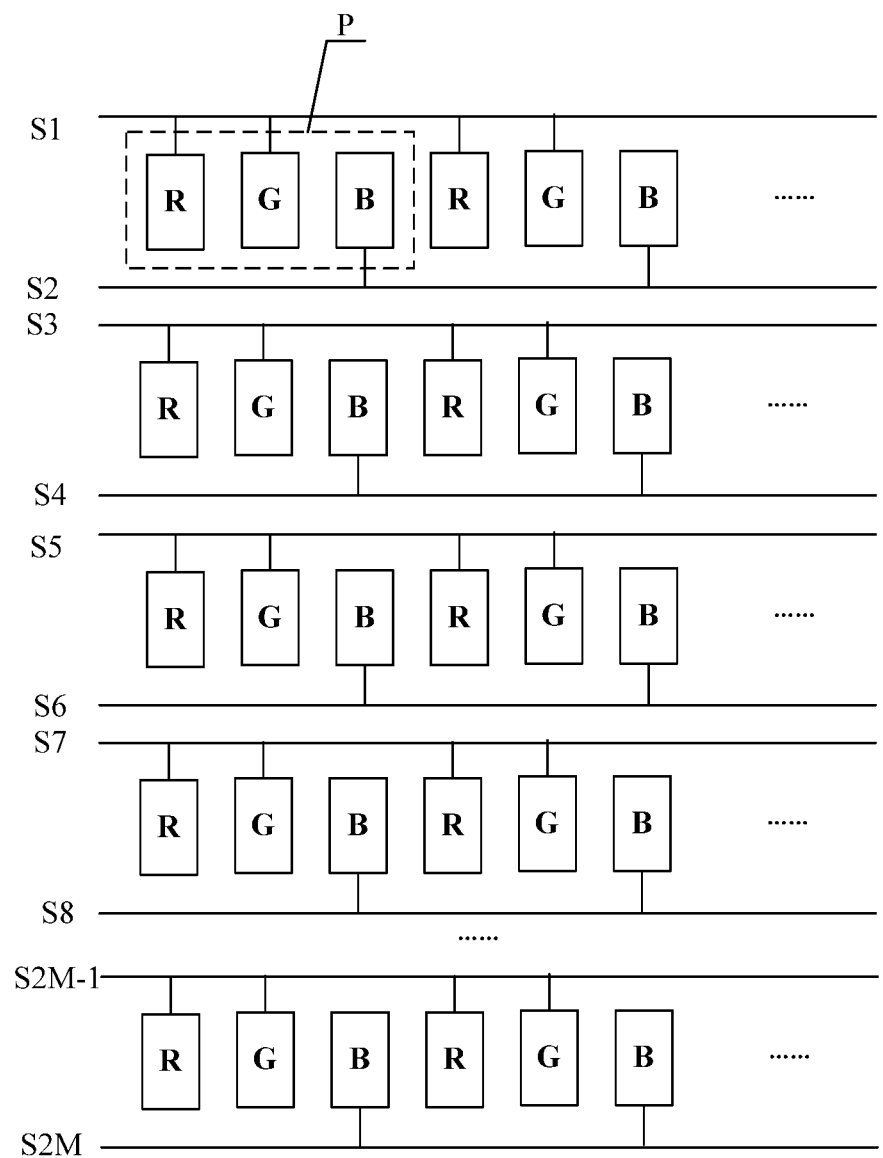
FIG. 1 is a schematic diagram 1 of pixel connection of a display substrate according to an embodiment of the present disclosure.

The present disclosure describes several embodiments, but the description is exemplary rather than restrictive, and those of ordinary skills in the art will recognize that more embodiments and implementation schemes are possible within the scope of the embodiments described in the present disclosure. Although many possible feature combinations are shown in the drawings and discussed in specific implementation modes, it is possible that the disclosed features may also be combined in many other manners. Unless specifically restricted, any feature or element of any embodiment may be combined with any other feature or element in any other embodiment for use, or may take the place of any other feature or element in any other embodiment.

The present disclosure includes and conceives combinations of features and elements well known to those of ordinary skills in the art. The disclosed embodiments, features and elements of the present disclosure may be combined with any regular features or elements to form a technical solution defined by the claims. Any feature or element of any embodiment may also be combined with features or elements from another technical solution to form another technical solution defined by the claims. Therefore, it should be understood that any features shown and/or discussed in the present disclosure may be implemented individually or in any appropriate combination. Therefore, no other limits are made to the embodiments, besides limits made by the appended claims and equivalent replacements thereof. In addition, various modifications and variations may be made within the scope of protection of the appended claims.

Unless otherwise defined, technical terms or scientific terms used in the present disclosure shall have common meanings as construed by those of ordinary skills in the art to which the present disclosure pertains. "First", "second", and similar terms used in the disclosure do not represent any sequence, number, or significance but are only adopted to distinguish different components. The word "comprise" or "include", etc. means that an element or article that precedes the word is inclusive of the element or article listed after the word and equivalents thereof, but does not exclude other elements or articles. Wordings such as "connect" or "connected" are not limited to physical or mechanical connection, but may include electrical connection, whether direct or indirect. "Above", "below", "left", "right", and the like are only used to indicate relative position relationships. When the absolute position of the described object changes, the relative position relationship may also change accordingly.

A wearable OLED display device adopts a real RGB pixel arrangement mode. When the wearable OLED display device displays the same static picture for a long time, an image sticking problem often occurs due to a hysteresis effect of a driving transistor in a pixel circuit. Furthermore, the pixel arrangement of the wearable OLED display device leads to higher power consumption of an OLED display product, and long standby time of the wearable OLED display device cannot be achieved.

Figure 2:
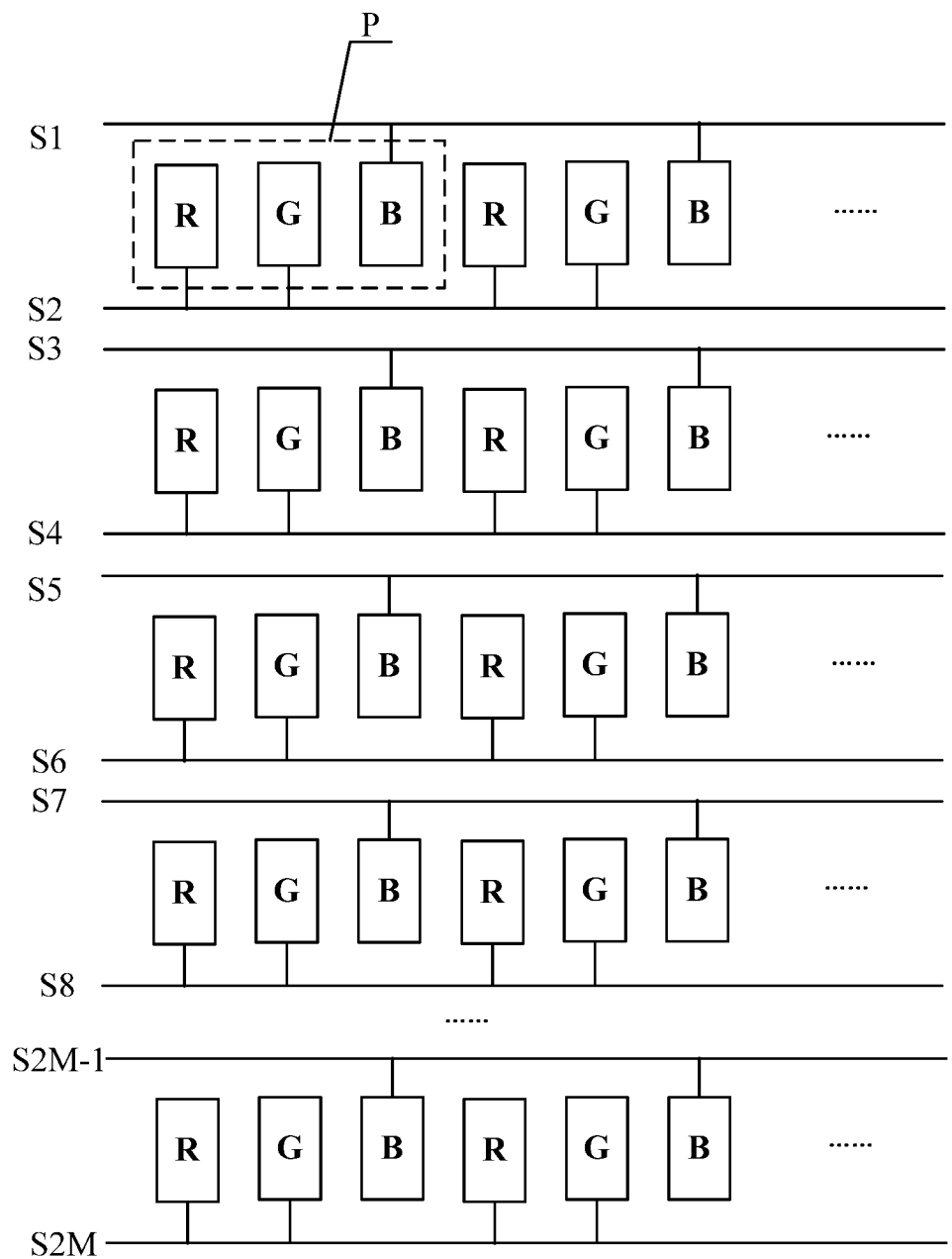
FIG. 2 is a schematic diagram 2 of pixel connection of a display substrate according to an embodiment of the present disclosure.

FIG. 1 is a schematic diagram 1 of pixel connection of a display substrate according to an embodiment of the present disclosure, and FIG. 2 is a schematic diagram 2 of pixel connection of a display substrate according to an embodiment of the present disclosure. As shown in FIG. 1 and FIG. 2, the display substrate provided by the embodiment of the present disclosure includes M rows and N columns of pixels P and 2M rows of scanning lines S1 to S2M. The scanning lines extend along a first direction, and pixels in an i-th row are electrically connected to a $(2i-1)$-th row of scanning line and a 2i-th row of scanning line respectively. Each pixel includes a first sub-pixel, a second sub-pixel and a third sub-pixel arranged along the first direction, the first sub-pixel and the second sub-pixel are sub-pixels of different colors and each may be one of a red sub-pixel and a green sub-pixel, and the third sub-pixel is a blue sub-pixel.

The first sub-pixel and the second sub-pixel of the pixels in the i-th row are connected to the same scanning line and electrically connected to one of the $(2i-1)$-th row of scanning line and the 2i-th row of scanning line, and the third sub-pixel of pixels in the i-th row is electrically connected to the other of the $(2i-1)$-th row of scanning line and the 2i-th row of scanning line. FIG. 1 illustrates that the first sub-pixel and the second sub-pixel of pixels in the i-th row are electrically connected to the $(2i-1)$-th row of scanning line, and the third sub-pixel of the pixels in the i-th row is electrically connected to the 2i-th row of scanning line, as an example, and FIG. 2 illustrates that the first sub-pixel and the second sub-pixel of pixels in the i-th row are electrically connected to the 2i-th row of scanning line, and the third sub-pixel of the pixels in the i-th row is electrically connected to the $(2i-1)$-th row of scanning line, as an example.

A display period of a picture displayed by the display substrate is N frames, and each frame of display picture includes N stages. When the display substrate is displaying, a first sub-pixel, a second sub-pixel and a third sub-pixel among two pixels located in a $(2i-1)$-th row, a j-th column, and a 2i-th row, a j-th column emit light at an i-th stage of each frame. While at the i-th stage of the adjacent frame, The first sub-pixel, the second sub-pixel and the third sub-pixel among two pixels located in the $(2i-1)$-th row, the j-th column, and the 2i-th row, the j-th column which emit light are all different, $j=1, 2, \ldots, N$, $1 \leq i \leq M/2$, M is an even number, $N \geq 1$.

In an exemplary embodiment, the first sub-pixel may be a red sub-pixel and the second sub-pixel may be a green sub-pixel, or the first sub-pixel may be the green sub-pixel and the second sub-pixel may be the red sub-pixel. FIG. 1 illustrates that the first sub-pixel may be the red sub-pixel and the second sub-pixel may be the green sub-pixel, as an example.

In an exemplary embodiment, the first sub-pixel, the second sub-pixel and the third sub-pixel may be arranged along the first direction.

In an exemplary embodiment, the picture displayed by the display substrate may be any picture that needs to be displayed through a screen of the display substrate.

As the power consumption of the blue sub-pixel is large, the embodiment of the present disclosure controls the blue sub-pixel and other sub-pixels with different scanning lines. In an exemplary embodiment, the red sub-pixels and the green sub-pixels of pixels in the same row are connected to the same scanning line, and the blue sub-pixels are connected to another scanning line. Through such a design, pixels of adjacent rows may be driven in a time-sharing manner, and the dual technical effects of image sticking resistance and power consumption reduction may be achieved.

According to the embodiment of the present disclosure, the first sub-pixel, the second sub-pixel and the third sub-pixel among two pixels located in the (2i−1)-th row, the j-th column, and the 2i-th row, the j-th column emit light at the i-th stage of each frame. While at the i-th stage of the adjacent frame, the first sub-pixel emitting light, the second sub-pixel emitting light and the third sub-pixel emitting light among two pixels located in the (2i−1)-th row, the j-th column, and the 2i-th row, the j-th column are all different. In the adjacent frame, each sub-pixel only emits light once, which not only provides sufficient time for discharge of sub-pixels and solves a problem of image sticking resistance, but also reduces the quantity of sub-pixels driven by scanning lines, thus reducing the power consumption.

An embodiment of the present disclosure provides a display substrate, a preparation method thereof and a wearable display device. The display substrate includes M rows and N columns of pixels and 2M rows of scanning lines; the scanning lines extend along a first direction, and pixels in an i-th row are electrically connected to a (2i−1)-th row of scanning line and a 2i-th row of scanning line respectively, and each pixel includes a first sub-pixel, a second sub-pixel and a third sub-pixel arranged along the first direction; the first sub-pixel and the second sub-pixel are sub-pixels of different colors and each may be one of a red sub-pixel and a green sub-pixel, and the third sub-pixel is a blue sub-pixel; the first sub-pixel and the second sub-pixel of the pixels in the i-th row are connected to the same scanning line and electrically connected to one of the (2i−1)-th row of scanning line and the 2i-th row of scanning line, and the third sub-pixel of pixels in the i-th row is electrically connected to the other of the (2i−1)-th row of scanning line and the 2i-th row of scanning line; and a display period of a picture displayed by the display substrate is N frames, and each frame of display picture includes N stages, when the display substrate is displaying, a first sub-pixel, a second sub-pixel and a third sub-pixel among two pixels located in a (2i−1)-th row, a j-th column, and a 2i-th row, a j-th column emit light at an i-th stage of each frame; while at an i-th stage of an adjacent frame, the first sub-pixel, the second sub-pixel and the third sub-pixel among two pixels located in the (2i−1)-th row, the j-th column, and the 2i-th row, the j-th column which emit light are all different. According to the embodiment of the present disclosure, different scanning lines are set, a light-emitting state of sub-pixels in adjacent rows may be driven in a time-sharing manner, so that the problems of high power consumption and image sticking in the wearable display device may be solved.

In an exemplary embodiment, the (2i−1)-th row of scanning line and the 2i-th row of scanning line may be located at both sides of pixels in the i-th row, respectively.

In an exemplary embodiment, a voltage value of a first scanning signal is greater than a voltage value of a second scanning signal, when the first sub-pixel and the second sub-pixel of pixels in the i-th row are electrically connected to the (2i−1)-th row of scanning line, and the third sub-pixel of the pixels in the i-th row is electrically connected to the 2i-th row of scanning line. Herein, the first scanning signal is a signal that makes sub-pixels connected to the (2i−1)-th row of scanning line emit light, and the second scanning signal is a signal that makes sub-pixels connected to the 2i-th row of scanning line emit light.

Since the power consumption of the blue sub-pixel is large, in an exemplary embodiment, the power consumption may be reduced by making a voltage value of a scanning signal of the scanning line connected to the third sub-pixel smaller than a voltage value of a scanning signal of the scanning line connected to the first sub-pixel.

In an exemplary embodiment, a refresh frequency of the first scanning signal is greater than that of the second scanning signal.

In an exemplary embodiment, the power consumption may be further reduced by making a refresh frequency of the scanning signal of the scanning line connected to the third sub-pixel smaller than a refresh frequency of the scanning signal of the scanning line connected to the first sub-pixel.

In an exemplary embodiment, the voltage value of the first scanning signal is smaller than the voltage value of the second scanning signal, when the first sub-pixel and the second sub-pixel of pixels in the i-th row are electrically connected to the 2i-th row of scanning line, and the third sub-pixel of the pixels in the i-th row is electrically connected to the (2i−1)-th row of scanning line. The first scanning signal is a signal that makes the sub-pixels connected to the (2i−1)-th row of scanning line emit light, and the second scanning signal is a signal that makes the sub-pixels connected to the 2i-th row of scanning line emit light.

Since the power consumption of the blue sub-pixel is large, in an exemplary embodiment, the power consumption may be reduced by making the voltage value of the scanning signal of the scanning line connected to the third sub-pixel smaller than the voltage value of the scanning signal of the scanning line connected to the first sub-pixel.

In an exemplary embodiment, the refresh frequency of the first scanning signal is smaller than the refresh frequency of the second scanning signal.

In an exemplary embodiment, the power consumption may be further reduced by making the refresh frequency of the scanning signal of the scanning line connected to the third sub-pixel smaller than the refresh frequency of the scanning signal of the scanning line connected to the first sub-pixel.

In an exemplary embodiment, the display substrate may further include a gate driving circuit and a processor; the gate driving circuit includes 2M shift registers which correspond to the 2M row of scanning lines one by one and are electrically connected to corresponding scanning lines.

The processor is electrically connected to 2M shift registers, and configured to control the shift registers to provide signals to the corresponding scanning lines, so that when the display substrate is displaying, the first sub-pixel, the second sub-pixel and the third sub-pixel among two pixels located in the (2i−1)-th row, the j-th column, and the 2i-th row, the j-th column emit light at the i-th stage of each frame; while at the i-th stage of the adjacent frame, the first sub-pixel, the second sub-pixel and the third sub-pixel among two pixels located in the (2i−1)-th row, the j-th column, and the 2i-th row, the j-th column which emit light are all different.

The embodiment of the present disclosure also provides a wearable display device, which includes a display substrate.

The display substrate is the display substrate according to any of the preceding embodiments, and has similar implementation principles and implementation effects, which will not be described further here.

In an exemplary embodiment, the wearable display device may be a wearable electronic device, such as a wristband, a watch, and a bracelet.

An embodiment of the present disclosure provides a driving method for a display substrate, for driving the display substrate. The driving method of the display substrate provided by the embodiment of the present disclosure includes the following act.

Signals are provided to scanning lines, so that when the display substrate is displaying, the first sub-pixel, the second sub-pixel and the third sub-pixel among two pixels located in the (2i−1)-th row, the j-th column, and the 2i-th row, the j-th column emit light at the i-th stage of each frame, while at the i-th stage of the adjacent frame, the first sub-pixel, the second sub-pixel and the third sub-pixel among two pixels located in the (2i−1)-th row, the j-th column, and the 2i-th row, the j-th column which emit light are all different.

The display substrate is the display substrate according to any of the preceding embodiments, and has similar implementation principles and implementation effects, which will not be described further here.

Figure 3:
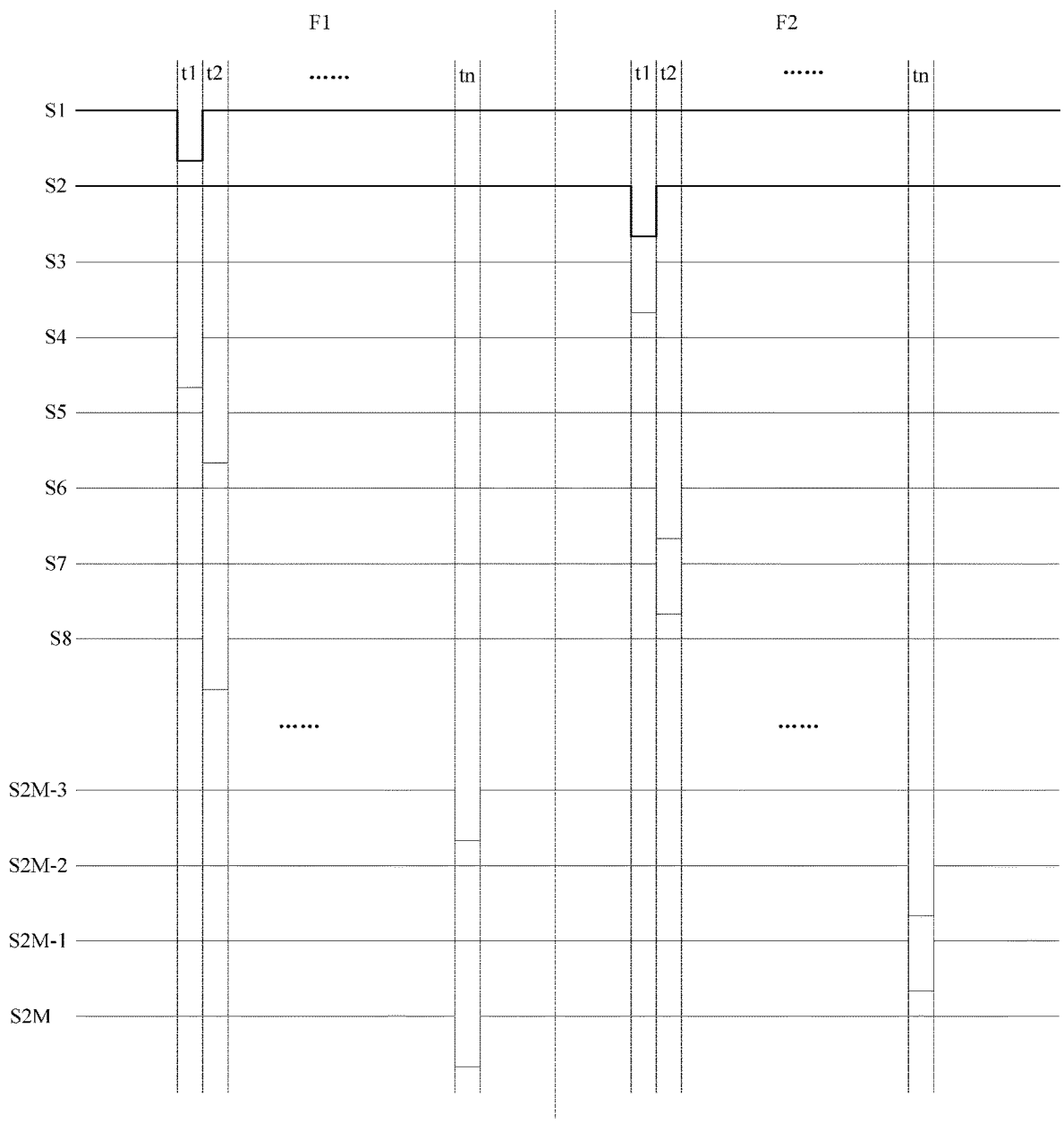
FIG. 3 is a timing diagram of signals of scanning lines according to an exemplary embodiment.
Figure 4:
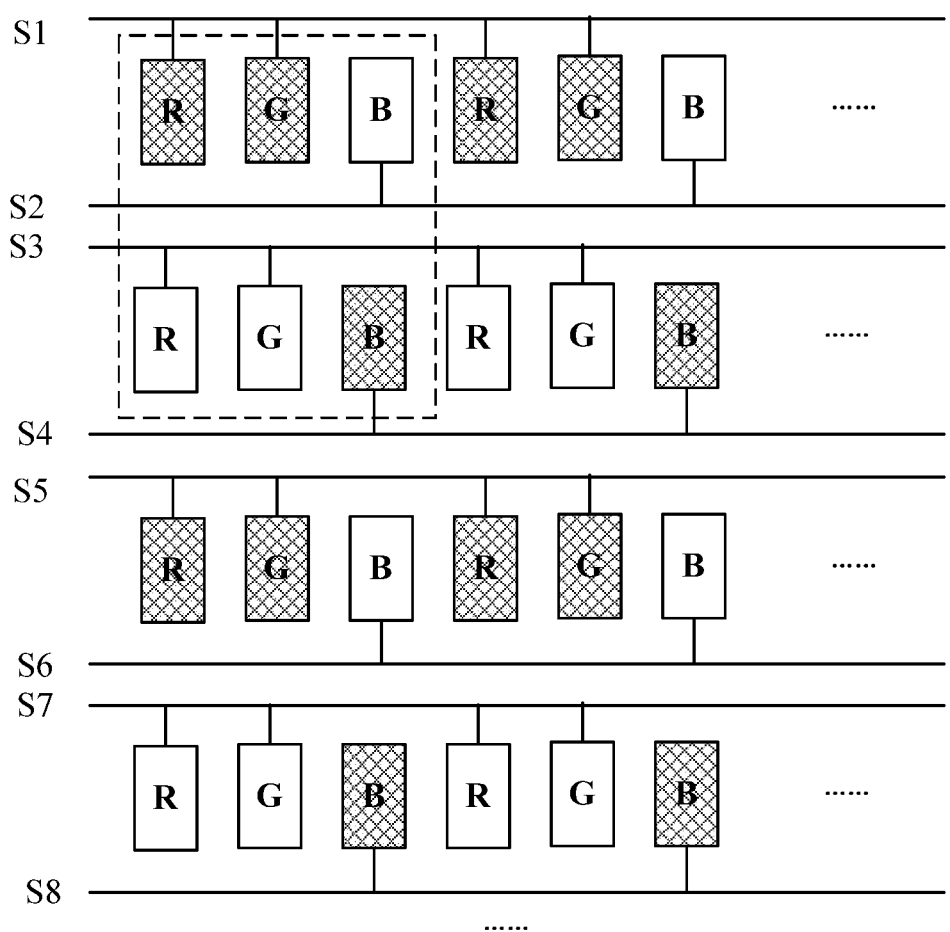
FIG. 4 is a schematic diagram 1 of a light-emitting state of sub-pixels of an odd frame according to an exemplary embodiment.
Figure 5:
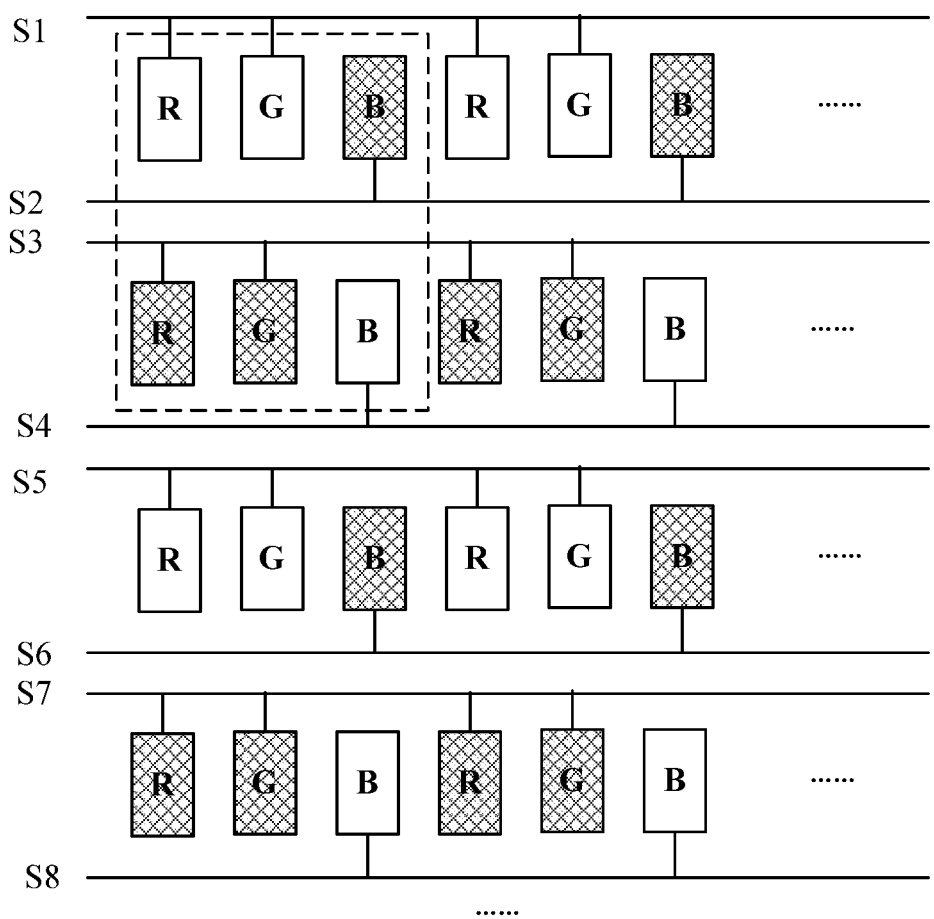
FIG. 5 is a schematic diagram 1 of a light-emitting state of sub-pixels of an even frame according to an exemplary embodiment.
Figure 6:
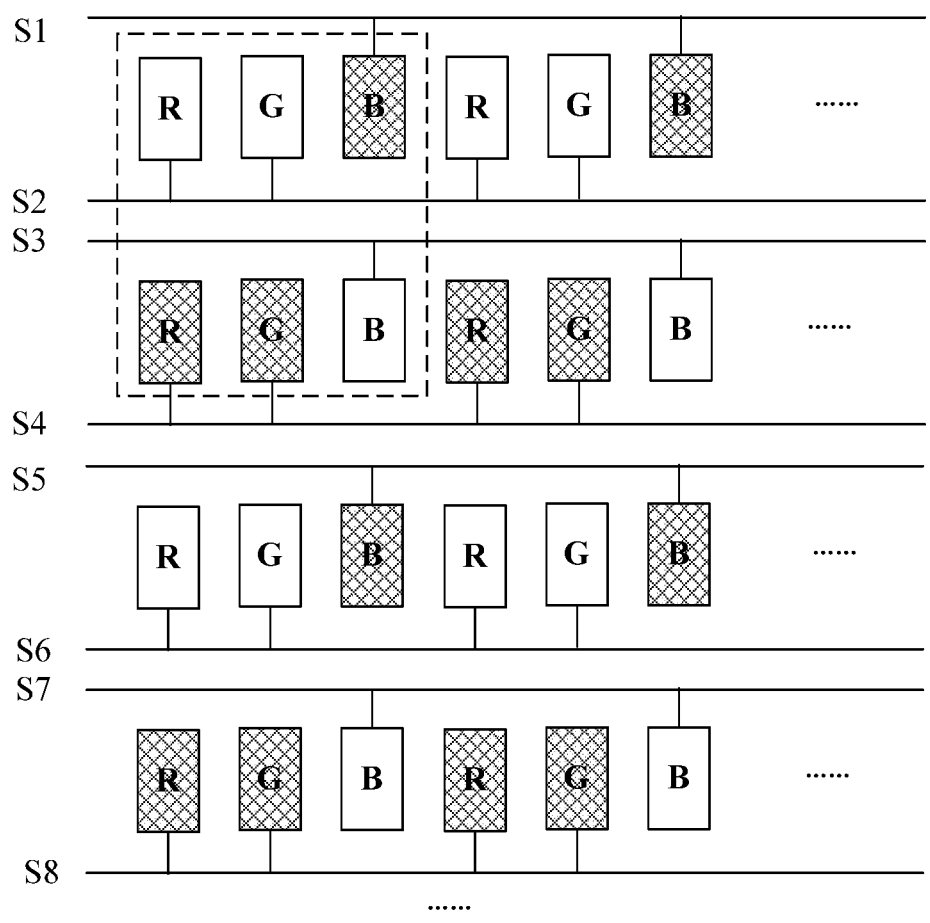
FIG. 6 is a schematic diagram 2 of a light-emitting state of sub-pixels of an odd frame according to an exemplary embodiment.
Figure 7:
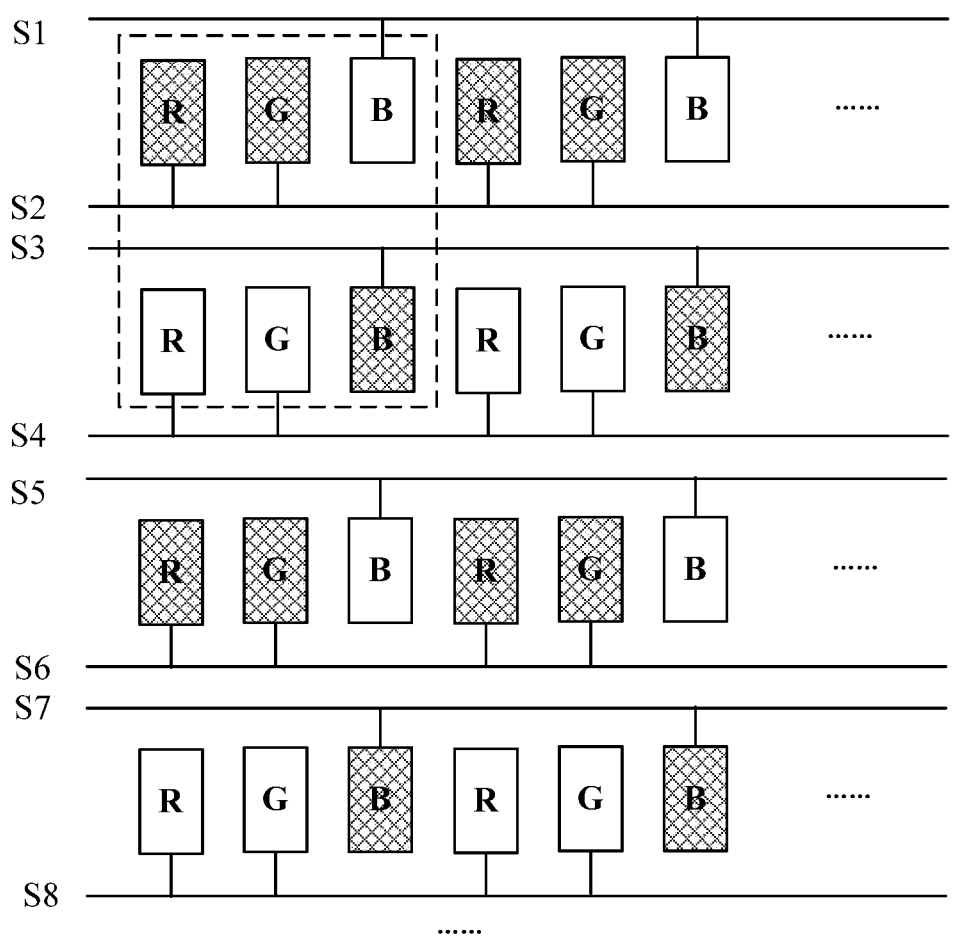
FIG. 7 is a schematic diagram 2 of a light-emitting state of sub-pixels of an even frame according to an exemplary embodiment.

FIG. 3 is a timing diagram of signals of scanning lines according to an exemplary embodiment, FIG. 4 is a schematic diagram 1 of a light-emitting state of sub-pixels of an odd frame according to an exemplary embodiment, FIG. 5 is a schematic diagram 1 of a light-emitting state of sub-pixels of an even frame according to an exemplary embodiment, FIG. 6 is a schematic diagram 2 of a light-emitting state of sub-pixels of an odd frame according to an exemplary embodiment, and FIG. 7 is a schematic diagram 2 of a light-emitting state of sub-pixels of an even frame according to an exemplary embodiment. FIG. 4 and FIG. 5 illustrate that a first sub-pixel and a second sub-pixel of pixels in an i-th row are electrically connected to a (2i−1)-th row of scanning line, and a third sub-pixel of pixels in an i-th row is electrically connected to a 2i-th row of scanning line, as an example. FIG. 6 and FIG. 7 illustrate that the first sub-pixel and the second sub-pixel of pixels in the i-th row are electrically connected to the 2i-th row of scanning line, and the third sub-pixel of the pixels in the i-th row are electrically connected to the (2i−1)-th row of scanning line, as an example. As shown in FIG. 3 to FIG. 7, each frame includes N stages t1 to tn, with F1 representing a first frame and F2 representing a second frame. In an exemplary embodiment, at an i-th stage of the odd frame, a valid level signal is provided to a (4i−3)-th row of scanning line and a 4i-th row of scanning line, and an invalid level signal is provided to a (4i−2)-th row of scanning line and a (4i−1)-th row of scanning line, and at an i-th stage of the even frame, the valid level signal is provided to the (4i−2)-th row of scanning line and the (4i−1)-th row of scanning line, and the invalid level signal is provided to the (4i−3)-th row of scanning line and the 4i-th row of scanning line. The valid level signal refers to a signal that makes the sub-pixels connected to the scanning lines emit light, and the invalid level signal refers to a signal that makes the sub-pixels connected to the scanning lines not emit light.

In an exemplary embodiment, each stage represents each moment.

In an exemplary embodiment, as shown in FIG. 3, FIG. 4 and FIG. 6, at a first stage t1 of the first frame F1, a valid level signal is provided to a first row of scanning line S1 and a fourth row of scanning line S4 to make sub-pixels connected to the first row of scanning line S1 and the fourth row of scanning line S4 emit light, and at a second stage t2, an valid level signal is provided to a fifth row of scanning line S5 and an eighth row of scanning line S8 to make sub-pixels connected to the fifth row of scanning line S5 and the eighth row of scanning line S8. Iteration is performed downward orderly with four adjacent rows of pixels as a unit until the scanning of one frame is completed. At a first stage t1 of the second frame F2, a valid level signal is provided to a second row of scanning line S2 and a third row of scanning line S3 to make sub-pixels connected to the second row of scanning line S2 and the third row of scanning line S3 emit light, at a second stage t2, a valid level signal is provided to a sixth row of scanning line S6 and a seventh row of scanning line S7 to make sub-pixels connected to the sixth scanning line S6 and the seventh scanning line S7 emit light. Iteration is performed downward orderly with four adjacent rows of pixels as a unit until the scanning of one frame is completed. Through this design, the adjacent pixels in the same frame can be extinguished in order. The driving rules of the first frame and the second frame are used continuously in display of a subsequent picture frame.

Combined with the time-sharing drive design of sub-pixel switches in the first frame and the second frame, the normal picture display may be ensured, and alternating regular extinguishment of all sub-pixels on the display substrate is achieved, so that the driving transistors in the sub-pixels may be reset, and then a problem of image sticking in a long-time static picture may be solved. In addition, the power consumption is reduced because adjacent sub-pixel rows are extinguished alternately.

In an exemplary embodiment, at an i-th stage of the odd frame, a voltage value of the valid level signal provided to the (4i−3)-th row of scanning line is greater than a voltage value of the valid level signal provided to the 4i-th row of scanning line, when the first sub-pixel and the second sub-pixel of pixels in the i-th row are electrically connected to the (2i−1)-th row of scanning line and the third sub-pixel of the pixels in the i-th row is electrically connected to the 2i-th row of scanning line, thereby reducing the power consumption.

In an exemplary embodiment, at the i-th stage of the odd frame, a refresh frequency of the valid level signal provided to the (4i−3)-th row of scanning line is greater than a refresh frequency of the valid level signal provided to the 4i-th row of scanning line, when the first sub-pixel and the second sub-pixel of pixels in the i-th row are electrically connected to the (2i−1)-th row of scanning line and the third sub-pixel of the pixels in the i-th row is electrically connected to the 2i-th row of scanning line, thereby reducing the power consumption.

In an exemplary embodiment, the refresh frequency of the valid level signal provided to the (4i−3)-th row of scanning line may be 120 Hz.

In an exemplary embodiment, the refresh frequency of the valid level signal provided to the 4i-th row of scanning line may be 90 Hz.

In an exemplary embodiment, at an i-th stage of the even frame, a voltage value of the valid level signal provided to the (4i−2)-th row of scanning line is smaller than that a voltage value of the valid level signal provided to the (4i−1)-th row of scanning line, when the first sub-pixel and the second sub-pixel of pixels in i-th row are electrically connected to the 2i-th row of scanning line and the third sub-pixel of the pixels in the i-th row is electrically connected to the 2i-th row of scanning line, thereby reducing the power consumption.

In an exemplary embodiment, at the i-th stage of the even frame, a refresh frequency of the valid level signal provided to the (4i−2)-th row of scanning line is smaller than a refresh frequency of the valid level signal provided to the (4i−1)-th row of scanning line, when the first sub-pixel and the second sub-pixel of pixels in the i-th row are electrically connected to the (2i−1)-th row of scanning line and the third sub-pixel of pixels in the i-th row is electrically connected to the 2i-th row of scanning line, thereby reducing the power consumption.

In an exemplary embodiment, the refresh frequency of the valid level signal provided to the (4i−1)-th scanning line may be 120 Hz.

In an exemplary embodiment, the refresh frequency of the valid level signal provided to the (4i−2)-th scanning line may be 90 Hz.

In an exemplary embodiment, at the i-th stage of the odd frame, the voltage value of the valid level signal provided to the (4i−3)-th row of scanning line is smaller than the voltage value of the valid level signal provided to the 4i-th row of scanning line, when the first sub-pixel and the second sub-pixel of pixels in the i-th row are electrically connected to the 2i-th row of scanning line and the third sub-pixel of the pixels in the i-th row is electrically connected to the (2i−1)-th row of scanning line, thereby reducing the power consumption.

In an exemplary embodiment, at the i-th stage of the odd frame, the refresh frequency of the valid level signal provided to the (4i−3)-th row of scanning line is smaller than the refresh frequency of the valid level signal provided to the 4i-th row of scanning line, when the first sub-pixel and the second sub-pixel of pixels in the i-th row are electrically connected to the 2i-th row of scanning line and the third sub-pixel of the pixels in the i-th row is electrically connected to the (2i−1)-th row of scanning line, thereby reducing the power consumption.

In an exemplary embodiment, the refresh frequency of the valid level signal provided to the 4i row of scanning line may be 120 Hz.

In an exemplary embodiment, the refresh frequency of the valid level signal provided to the (4i−3)-th row of scanning line may be 90 Hz.

In an exemplary embodiment, at the i-th stage of the even frame, the voltage value of the valid level signal provided to the (4i−2)-th row of scanning line is greater than the voltage value of the valid level signal provided to the (4i−1)-th row of scanning line, when the first sub-pixel and the second sub-pixel of pixels in the i-th row are electrically connected to the 2i-th row of scanning line and the third sub-pixel of the pixels in the i-th row is electrically connected to the (2i−1)-th row of scanning line, thereby reducing the power consumption.

In an exemplary embodiment, at the i-th stage of the even frame, the refresh frequency of the valid level signal provided to the (4i−2)-th row of scanning line is greater than the refresh frequency of the valid level signal provided to the (4i−1)-th row of scanning line, when the first sub-pixel and the second sub-pixel of pixels in the i-th row are electrically connected to the 2i-th row of scanning line and the third sub-pixel of the pixels in the i-th row is electrically connected to the (2i−1)-th row of scanning line, thereby reducing the power consumption.

In an exemplary embodiment, the refresh frequency of the valid level signal provided to the (4i−2)-th row of scanning line may be 120 Hz.

In an exemplary embodiment, the refresh frequency of the valid level signal provided to the (4i−1)-th row of scanning line may be 90 Hz.

Figure 8:
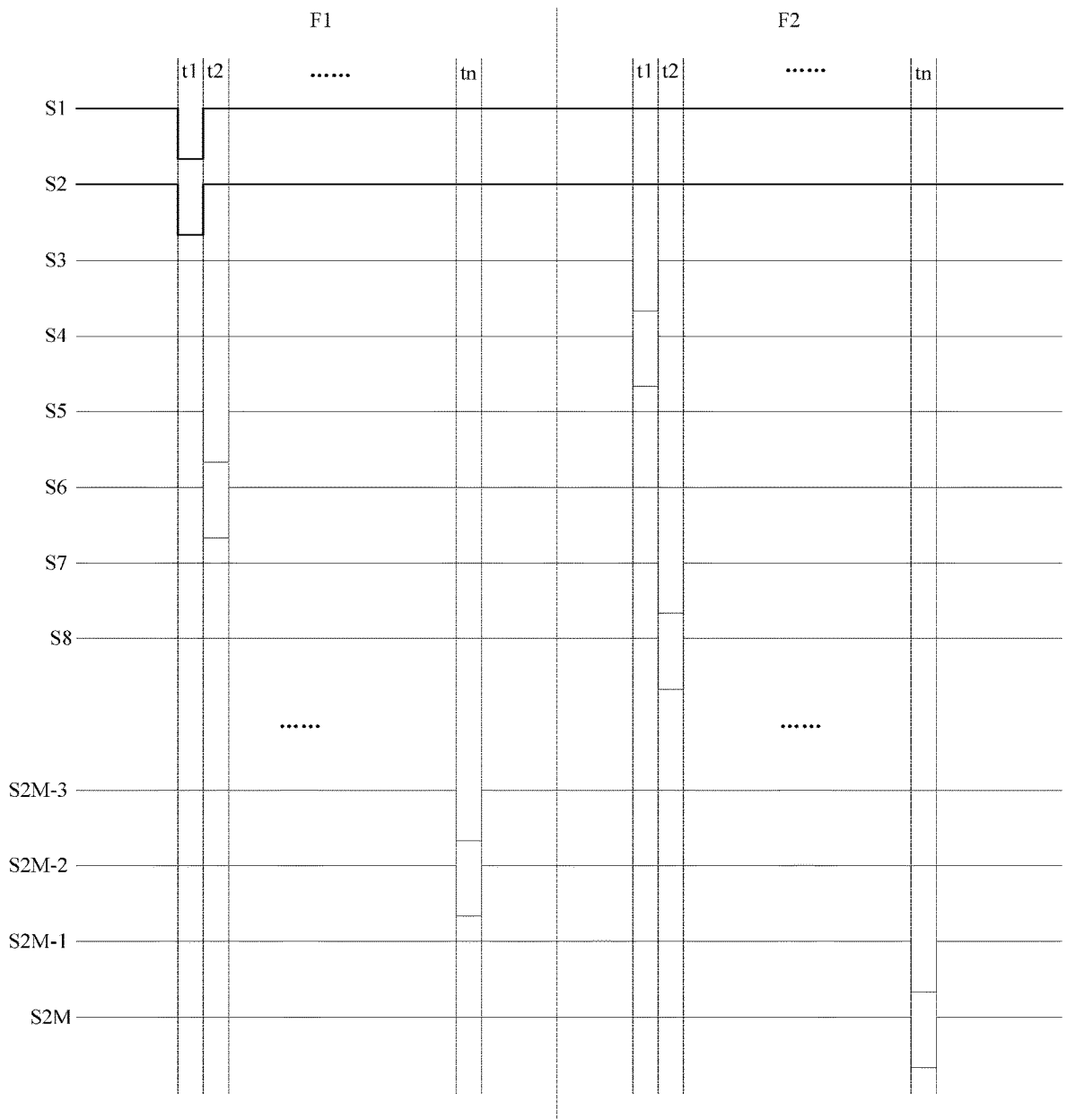
FIG. 8 is a timing diagram of signals of scanning lines according to another exemplary embodiment.
Figure 9:
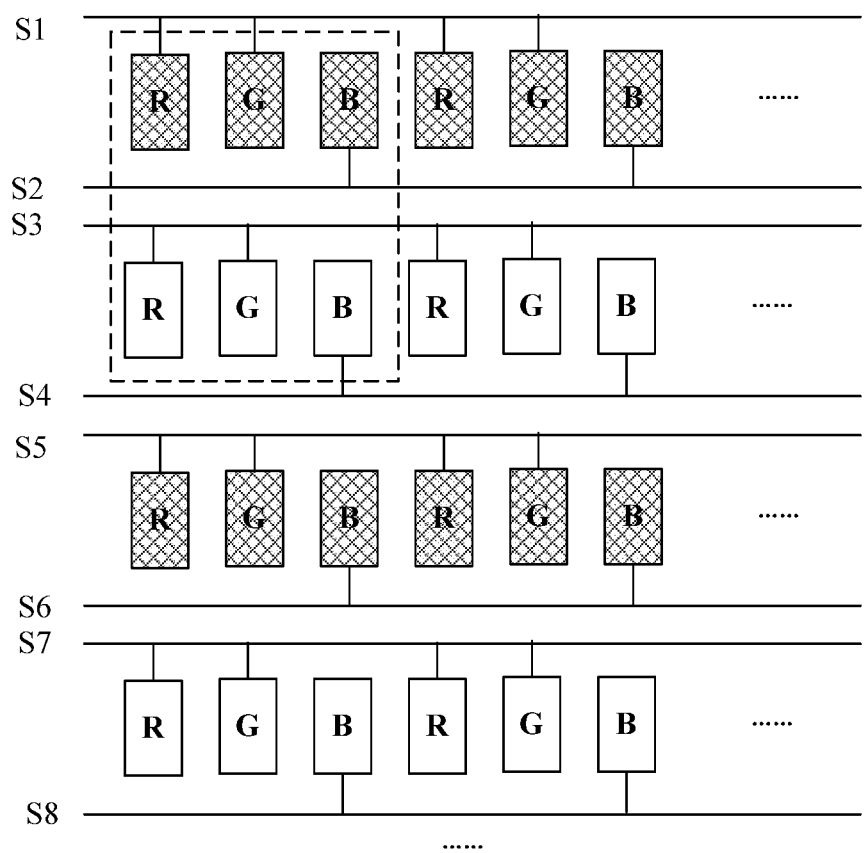
FIG. 9 is a schematic diagram 1 of a light-emitting state of sub-pixels of an odd frame according to another exemplary embodiment.
Figure 10:
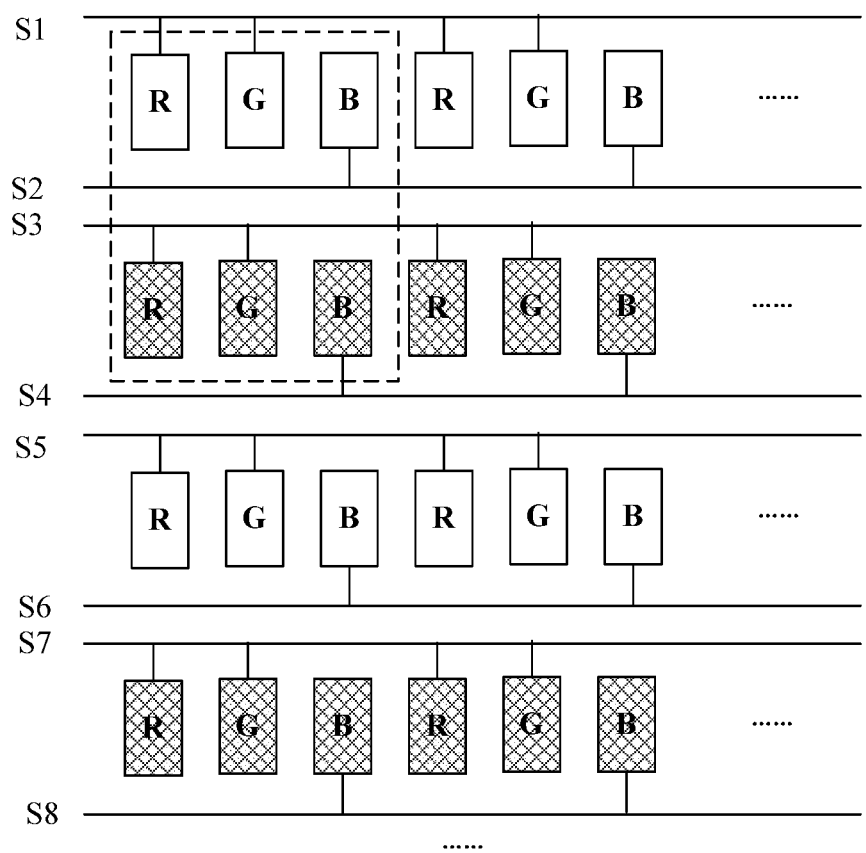
FIG. 10 is a schematic diagram 1 of a light-emitting state of sub-pixels of an even frame according to another exemplary embodiment.
Figure 11:
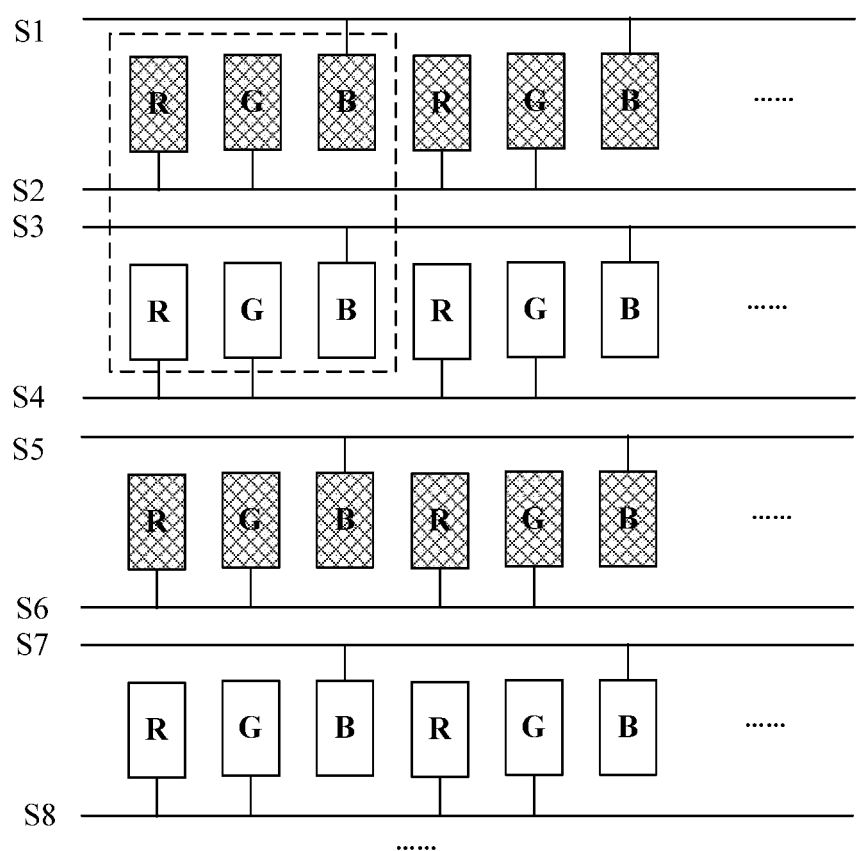
FIG. 11 is a schematic diagram 2 of a light-emitting state of sub-pixels of an odd frame according to another exemplary embodiment.
Figure 12:
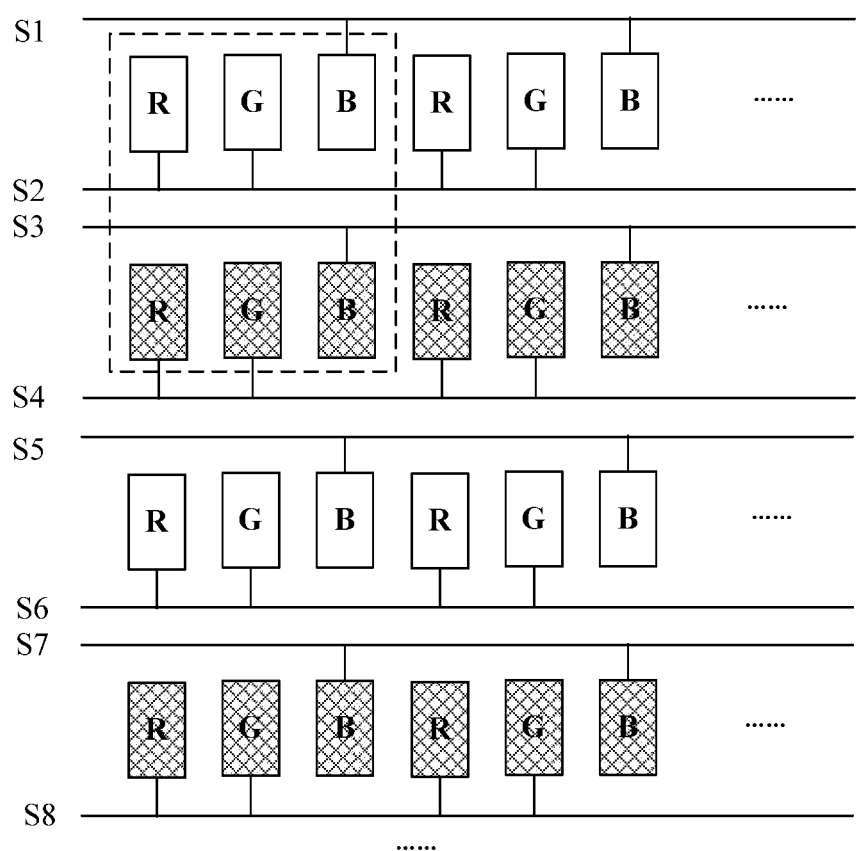
FIG. 12 is a schematic diagram 2 of a light-emitting state of sub-pixels of an even frame according to another exemplary embodiment.

FIG. 8 is a timing diagram of signals of scanning lines according to another exemplary embodiment, FIG. 9 is a schematic diagram 1 of a light-emitting state of sub-pixels of an odd frame according to another exemplary embodiment, FIG. 10 is a schematic diagram 1 of a light-emitting state of sub-pixels of an even frame according to another exemplary embodiment, FIG. 11 is a schematic diagram 2 of a light-emitting state of sub-pixels of an odd frame according to another exemplary embodiment, and FIG. 12 is a schematic diagram 2 of a light-emitting state of sub-pixels of an even frame according to another exemplary embodiment. FIG. 9 and FIG. 10 illustrate that a first sub-pixel and a second sub-pixel of pixels in an i-th row are electrically connected to a (2i−1)-th row of scanning line, and a third sub-pixel of the pixels in the i-th row is electrically connected to the 2i-th row of scanning line, as an example. FIG. 11 and FIG. 12 illustrate that the first sub-pixel and the second sub-pixel of pixels in the i-th row are electrically connected to the 2i-th row of scanning line, and the third sub-pixel of the pixels in the i-th row is electrically connected to the (2i−1)-th row of scanning line, as an example. As shown in FIG. 8 to FIG. 12, each frame includes N stages t1 to tn, with F1 representing a first frame and F2 representing a second frame. In an exemplary embodiment, at an i-th stage of an odd frame, a valid level signal is provided to a (4i−3)-th row of scanning line and a (4i−2)-th row of scanning line, and an invalid level signal is provided to a (4i−1)-th row of scanning line and a 4i-th row of scanning line, and at an i-th stage of an even frame, the valid level signal is provided to the (4i−1)-th row of scanning line and the 4i-th row of scanning line, and the invalid level signal is provided to the (4i−3)-th row of scanning line and the (4i−2)-th row of scanning line. The valid level signal refers to a signal that makes the sub-pixels connected to the scanning lines emit light, and the invalid level signal refers to a signal that makes the sub-pixels connected to the scanning lines not emit light.

In an exemplary embodiment, as shown in FIG. 8, FIG. 9 and FIG. 11, in a first stage t1 of the first frame F1, a valid level signal is provided to a first row of scanning line S1 and a second row of scanning line S2 to make sub-pixels connected to the first scanning line S1 and the second scanning line S2 emit light, and in a second stage t2, a valid level signal is provided to a fifth row of scanning line S5 and a sixth row of scanning line S6 to make sub-pixels connected to the fifth row of scanning line S5 and the sixth row of scanning line S6 emit light. Iteration is performed downward orderly with four adjacent rows of pixels as a unit until the scanning of one frame is completed. Through this design, the adjacent pixels in the same frame can be extinguished in order.

In an exemplary embodiment, as shown in FIG. 8, FIG. 10 and FIG. 12, in a first stage t1 of the second frame F2, a valid level signal is provided to a third scanning line S3 and a fourth scanning line S4, so that sub-pixels connected to the third scanning line S3 and the fourth scanning line S4 emit light, and in a second stage t2, a valid level signal is provided to a seventh scanning line S7 and an eighth scanning line S8, so that sub-pixels connected to the seventh scanning line S7 and the eighth scanning line S8 emit light. Iteration is performed downward orderly with four adjacent rows of pixels as a unit until the scanning of one frame is completed.

Through this design, the adjacent pixels in the same frame can be extinguished in order. The driving rules of the first frame and the second frame are used continuously in display of a subsequent picture frame.

Combined with the time-sharing drive design of sub-pixel switches in the first frame and the second frame, the normal picture display may be ensured, and alternating regular extinguishment of all sub-pixels on the display substrate is achieved, so that the driving transistors in the sub-pixels may be reset, and then a problem of image sticking in a long-time static picture may be solved. In addition, the power consumption is reduced because adjacent sub-pixel rows are extinguished alternately.

In an exemplary embodiment, at the i-th stage of the odd frame, a voltage value of the valid level signal provided to the (4i−3)-th row of scanning line is greater than a voltage value of the valid level signal provided to the (4i−2)-th row of scanning line, when the first sub-pixel and the second sub-pixel of pixels in the i-th row are electrically connected to the (2i−1)-th scanning line and the third sub-pixel of the pixels in the i-th row is electrically connected to the 2i-th scanning line, thereby reducing the power consumption.

In an exemplary embodiment, at the i-th stage of the odd frame, a refresh frequency of the valid level signal provided to the (4i−3)-th row of scanning line is greater than a refresh frequency of the valid level signal provided to the (4i−2)-th row of scanning line, when the first sub-pixel and the second sub-pixel of pixels in the i-th row are electrically connected to the (2i−1)-th row of scanning line and the third sub-pixel of the pixels in the i-th row is electrically connected to the 2i-th row of scanning line, thereby reducing the power consumption.

In an exemplary embodiment, the refresh frequency of the valid level signal provided to the (4i−3)-th row of scanning line may be 120 Hz.

In an exemplary embodiment, the refresh frequency of the valid level signal provided to the (4i−2)-th row of scanning line may be 90 Hz.

In an exemplary embodiment, at the i-th stage of the even frame, a voltage value of the valid level signal provided to the (4i−1)-th row of scanning line is greater than a voltage value of the valid level signal provided to the 4i-th row of scanning line, when the first sub-pixel and the second sub-pixel of pixels in the i-th row are electrically connected to the (2i−1)-th row of scanning line and the third sub-pixel of the pixels in the i-th row is electrically connected to the 2i-th row of scanning line, thereby reducing the power consumption.

In an exemplary embodiment, at the i-th stage of the even frame, a refresh frequency of the valid level signal provided to the (4i−1)-th row of scanning line is greater than a refresh frequency of the valid level signal provided to the 4i-th row of scanning line, when the first sub-pixel and the second sub-pixel of pixels in the i-th row are electrically connected to the (2i−1)-th scanning line and the third sub-pixel of the pixels in the i-th row is electrically connected to the 2i-th scanning line, thereby reducing the power consumption.

In an exemplary embodiment, the refresh frequency of the valid level signal provided to the 4i-th row of scanning line may be 90 Hz.

In an exemplary embodiment, the refresh frequency of the valid level signal provided to the (4i−1)-th row of scanning line may be 120 Hz.

In an exemplary embodiment, at the i-th stage of the odd frame, a voltage value of the valid level signal provided to the (4i−3)-th row of scanning line is smaller than a voltage value of the valid level signal provided to the (4i−2)-th row of scanning line, when the first sub-pixel and the second sub-pixel of pixels in the i-th row are electrically connected to the 2i-th row of scanning line and the third sub-pixel of the pixels in the i-th row is electrically connected to the (2i−1)-th row of scanning line.

In an exemplary embodiment, at the i-th stage of the odd frame, a refresh frequency of the valid level signal provided to the (4i−3)-th row of scanning line is smaller than a refresh frequency of the valid level signal provided to the (4i−2)-th row of scanning line, when the first sub-pixel and the second sub-pixel of pixels in the i-th row are electrically connected to the 2i-th row of scanning line and the third sub-pixel of the pixels in the i-th row is electrically connected to the (2i−1)-th row of scanning line.

In an exemplary embodiment, the refresh frequency of the valid level signal provided to the (4i−3)-th row of scanning line may be 90 Hz.

In an exemplary embodiment, the refresh frequency of the valid level signal provided to the (4i−2)-th row of scanning line may be 120 Hz.

In an exemplary embodiment, at the i-th stage of the even frame, a voltage value of the valid level signal provided to the (4i−1)-th row of scanning line is smaller than that a voltage value of the valid level signal provided to the 4i-th row of scanning line, when the first sub-pixel and the second sub-pixel of pixels in the i-th row are electrically connected to the 2i-th scanning line and the third sub-pixel of the pixels in the i-th row is electrically connected to the (2i−1)-th scanning line, thereby reducing the power consumption.

In an exemplary embodiment, at the i-th stage of the even frame, a refresh frequency of the valid level signal provided to the (4i−1)-th row of scanning line is smaller than a refresh frequency of the valid level signal provided to the 4i-th row of scanning line, when the first sub-pixel and the second sub-pixel of pixels in the i-th row are electrically connected to the 2i-th row of scanning line and the third sub-pixel of the pixels in the i-th row is electrically connected to the (2i−1)-th row of scanning line, thereby reducing the power consumption.

In an exemplary embodiment, the refresh frequency of the valid level signal provided to the (4i−1)-th row of scanning line may be 90 Hz.

In an exemplary embodiment, the refresh frequency of the valid level signal provided to the 4i-th row of scanning line may be 120 Hz.

The drawings of the embodiments of the present disclosure only involve the structures involved in the embodiments of the present disclosure, and the other structures may refer to conventional designs.

For clarity, the thickness and dimension of layers or micro-structures are magnified in the accompanying drawings used for describing the embodiments of the present disclosure. It can be understood that when an element, such as a layer, a film, a region or a substrate, is referred to as being located "above" or "below" another element, the element may be "directly" located "above" or "below" another element, or an intermediate element may exist.

Although the embodiments disclosed in the present disclosure are as described above, the content described is only the embodiments used to facilitate the understanding of the present disclosure, and is not intended to limit the present disclosure. Anyone skills in the art to which the present disclosure belongs can make any modifications and changes in the implementation forms and details without departing from the spirit and scope disclosed in the present disclosure.

However, the scope of patent protection of the present disclosure is still subject to the scope defined by the appended claims.

What we claim is:

1. A display substrate, comprising:

M rows and N columns of pixels and 2M scanning lines, wherein the scanning lines extend along a first direction, and pixels in an i-th row are electrically connected to a (2i-1)-th scanning line and a 2i-th scanning line respectively, and each pixel comprises a first sub-pixel, a second sub-pixel and a third sub-pixel arranged along the first direction; the first sub-pixel and the second sub-pixel are sub-pixels of different colors and are one of a red sub-pixel and a green sub-pixel, and the third sub-pixel is a blue sub-pixel;

the first sub-pixel and the second sub-pixel of the pixels in the i-th row are connected to a same scanning line and electrically connected to one of the (2i-1)-th scanning line and the 2i-th scanning line, and the third sub-pixel of the pixels in the i-th row is electrically connected to the other scanning line of the (2i-1)-th scanning line and the 2i-th scanning line; and a display period of a picture displayed by the display substrate is N frames, and each frame of display picture comprises N stages, in a case that the display substrate is displaying, at an i-th stage of each frame, a first sub-pixel, a second sub-pixel and a third sub-pixel among two pixels located in a (2i-1)-th row, a j-th column, and a 2i-th row, a j-th column, the sub-pixels in two adjacent rows, the (2i-1)-th row and the 2i-th row are driven simultaneously, emit light; at an i-th stage of an adjacent frame, the first sub-pixel, the second sub-pixel and the third sub-pixel among two pixels located in the (2i-1)-th row, the j-th column, and the 2i-th row, the j-th column, the sub-pixels in two adjacent rows, the (2i-1)-th row and the 2i-th row are driven simultaneously, which emit light are all different, j=1, 2, ..., N, 1≤i≤M/2, N is an even number, N≥1.

2. The display substrate according to claim 1, wherein the (2i-1)-th scanning line and the 2i-th scanning line are located at both sides of the pixels in the i-th row, respectively.

3. The display substrate according to claim 1, wherein a voltage value of a first scanning signal is greater than a voltage value of a second scanning signal, in a case that the first sub-pixel and the second sub-pixel of the pixels in the i-th row are electrically connected to the (2i-1)-th scanning line, and the third sub-pixel of the pixels in the i-th row is electrically connected to the 2i-th scanning line;

the first scanning signal is a signal that enables sub-pixels connected to the (2i-1)-th scanning line to emit light, and the second scanning signal is a signal that enables sub-pixels connected to the 2i-th scanning line to emit light.

4. The display substrate according to claim 3, wherein a refresh frequency of the first scanning signal is greater than a refresh frequency of the second scanning signal.

5. The display substrate according to claim 1, wherein a voltage value of a first scanning signal is smaller than a voltage value of a second scanning signal, in a case that the first sub-pixel and the second sub-pixel of the pixels in the i-th row are electrically connected to the 2i-th scanning line, and the third sub-pixel of the pixels in the i-th row is electrically connected to the (2i-1)-th scanning line; and the first scanning signal is a signal that enables sub-pixels connected to the (2i-1)-th scanning line to emit light, and the second scanning signal is a signal that enables sub-pixels connected to the 2i-th scanning line to emit light.

6. The display substrate according to claim 5, wherein a refresh frequency of the first scanning signal is smaller than a refresh frequency of the second scanning signal.

7. The display substrate according to claim 1, further comprising a gate driving circuit and a processor; the gate driving circuit comprises 2M shift registers which correspond to the 2M scanning lines one by one and are electrically connected to corresponding scanning lines; and the processor is electrically connected to the 2M shift registers, and configured to control the shift registers to provide signals to the corresponding scanning lines, which allows in a case that the display substrate is displaying, at the i-th stage of each frame, the first sub-pixel, the second sub-pixel and the third sub-pixel among two pixels located in the (2i-1)-th row, the j-th column, and the 2i-th row, the j-th column emit light; at the i-th stage of the adjacent frame, the first sub-pixel, the second sub-pixel and the third sub-pixel among two pixels located in the (2i-1)-th row, the j-th column, and the 2i-th row, the j-th column which emit light are all different.

8. A wearable display device, comprising:

a display substrate, wherein the display substrate comprises M rows and N columns of pixels and 2M scanning lines, wherein the scanning lines extend along a first direction, and pixels in an i-th row are electrically connected to a (2i-1)-th scanning line and a 2i-th scanning line respectively, and each pixel comprises a first sub-pixel, a second sub-pixel and a third sub-pixel arranged along the first direction; the first sub-pixel and the second sub-pixel are sub-pixels of different colors and are one of a red sub-pixel and a green sub-pixel, and the third sub-pixel is a blue sub-pixel;

the first sub-pixel and the second sub-pixel of the pixels in the i-th row are connected to a same scanning line and electrically connected to one of the (2i-1)-th scanning line and the 2i-th scanning line, and the third sub-pixel of pixels in the i-th row is electrically connected to the other scanning line of the (2i-1)-th scanning line and the 2i-th scanning line; and a display period of a picture displayed by the display substrate is N frames, and each frame of the displayed picture comprises N stages, in a case that the display substrate is displaying, at an i-th stage of each frame, a first sub-pixel, a second sub-pixel and a third sub-pixel among two pixels located in a (2i-1)-th row, a j-th column, and a 2i-th row, a j-th column, the sub-pixels in two adjacent rows, the (2i-1)-th row and the 2i-th row are driven simultaneously, emit light; at an i-th stage of an adjacent frame, the first sub-pixel, the second sub-pixel and the third sub-pixel among two pixels located in the (2i-1)-th row, the j-th column, and the 2i-th row, the j-th column, the sub-pixels in two adjacent rows, the (2i-1)-th row and the 2i-th row are driven simultaneously, which emit light are all different, j=1, 2, ..., N, 1≤i≤M/2, N is an even number, N≥1.

9. The wearable display device according to claim 8, wherein the (2i-1)-th scanning line and the 2i-th scanning line are located at both sides of the pixels in the i-th row, respectively.

10. The wearable display device according to claim 8, wherein, a voltage value of a first scanning signal is greater than a voltage value of a second scanning signal, in a case that the first sub-pixel and the second sub-pixel of the pixels in i-th row are electrically connected to the (2i−1)-th scanning line, and the third sub-pixel of the pixels in the i-th row is electrically connected to the 2i-th scanning line;

the first scanning signal is a signal that enables sub-pixels connected to the (2i−1)-th scanning line to emit light, and the second scanning signal is a signal that enables sub-pixels connected to the 2i-th scanning line to emit light.

11. The wearable display device according to claim 8, wherein a voltage value of the first scanning signal is smaller than a voltage value of the second scanning signal, in a case that the first sub-pixel and the second sub-pixel of the pixels in the i-th row are electrically connected to the 2i-th scanning line, and the third sub-pixel of the pixels in the i-th row is electrically connected to the (2i−1)-th scanning line; and the first scanning signal is a signal that enables sub-pixels connected to the (2i−1)-th scanning line to emit light, and the second scanning signal is a signal that enables sub-pixels connected to the 2i-th scanning line to emit light.

12. The wearable display device according to claim 8, wherein the display substrate further comprises a gate driving circuit and a processor; the gate driving circuit comprises 2M shift registers which correspond to the 2M scanning lines one by one and are electrically connected to corresponding scanning lines; and the processor is electrically connected to the 2M shift registers, and configured to control the shift registers to provide signals to the corresponding scanning lines, which allows in a case that the display substrate is displaying, at the i-th stage of each frame, the first sub-pixel, the second sub-pixel and the third sub-pixel among two pixels located in the (2i−1)-th row, the j-th column, and the 2i-th row, the j-th column emit light; at the i-th stage of the adjacent frame, the first sub-pixel, the second sub-pixel and the third sub-pixel among two pixels located in the (2i−1)-th row, the j-th column, and the 2i-th row, the j-th column which emit light are all different.

13. A control method for a display substrate, configured to control the display substrate according to claim 1, and the method comprising:

providing signals to the scanning lines, allowing in a case that the display substrate is displaying, at the i-th stage of each frame, the first sub-pixel, the second sub-pixel and the third sub-pixel among two pixels located in the (2i−1)-th row, the j-th column, and the 2i-th row, the j-th column emit light; at the i-th stage of the adjacent frame, the first sub-pixel, the second sub-pixel and the third sub-pixel among two pixels located in the (2i−1)-th row, the j-th column, and the 2i-th row, the j-th column which emit light are all different.

14. The control method according to claim 13, wherein at an i-th stage of an odd frame, a valid level signal is provided to a (4i−3)-th scanning line and a 4i-th scanning line, and an invalid level signal is provided to a (4i−2)-th scanning line and a (4i−1)-th scanning line, and at an i-th stage of an even frame, the valid level signal is provided to the (4i−2)-th scanning line and the (4i−1)-th scanning line, and the invalid level signal is provided to the (4i−3)-th scanning line and the 4i-th scanning line; and wherein the valid level signal refers to a signal that enables sub-pixels connected to the scanning lines to emit light, and the invalid level signal refers to a signal that enables sub-pixels connected to the scanning lines not to emit light.

15. The control method according to claim 13, wherein at an i-th stage of an odd frame, a valid level signal is provided to a (4i−3)-th scanning line and a (4i−2)-th scanning line, and an invalid level signal is provided to a (4i−1)-th scanning line and a 4i-th scanning line, and at an i-th stage of an even frame, the valid level signal is provided to the (4i−1)-th scanning line and the 4i-th scanning line, and the invalid level signal is provided to the (4i−3)-th scanning line and the (4i−2)-th scanning line; and wherein the valid level signal refers to a signal that enables sub-pixels connected to the scanning lines to emit light, and the invalid level signal refers to a signal that enables sub-pixels connected to the scanning lines not to emit light.

16. The control method according to claim 14, wherein in a case that the first sub-pixel and the second sub-pixel of pixels in the i-th row are electrically connected to the (2i−1)-th scanning line and the third sub-pixel of the pixels in the i-th row is electrically connected to the 2i-th scanning line, at the i-th stage of the odd frame, a voltage value of the valid level signal provided to the (4i−3)-th scanning line is greater than a voltage value of the valid level signal provided to the 4i-th scanning line, and a refresh frequency of the valid level signal provided to the (4i−3)-th scanning line is greater than a refresh frequency of the valid level signal provided to the 4i-th scanning line; and at the i-th stage of the even frame, a voltage value of the valid level signal provided to the (4i−2)-th scanning line is smaller than that a voltage value of the valid level signal provided to the (4i−1)-th scanning line, and a refresh frequency of the valid level signal provided to the (4i−2)-th scanning line is smaller than a refresh frequency of the valid level signal provided to the (4i−1)-th scanning line.

17. The control method according to claim 14, wherein in a case that the first sub-pixel and the second sub-pixel of pixels in the i-th row are electrically connected to the 2i-th scanning line and the third sub-pixel of the pixels in the i-th row is electrically connected to the (2i−1)-th scanning line, at the i-th stage of the odd frame, a voltage value of the valid level signal provided to the (4i−3)-th scanning line is smaller than a voltage value of the valid level signal provided to the 4i-th scanning line, and a refresh frequency of the valid level signal provided to the (4i−3)-th scanning line is smaller than a refresh frequency of the valid level signal provided to the 4i-th scanning line; and at the i-th stage of the even frame, a voltage value of the valid level signal provided to the (4i−2)-th scanning line is greater than that a voltage value of the valid level signal provided to the (4i−1)-th scanning line, and a refresh frequency of the valid level signal provided to the (4i−2)-th scanning line is greater than a refresh frequency of the valid level signal provided to the (4i−1)-th scanning line.

18. The control method according to claim 15, wherein in a case that the first sub-pixel and the second sub-pixel of pixels in the i-th row are electrically connected to the (2i−1)-th scanning line and the third sub-pixel of the pixels in the i-th row is electrically connected to the 2i-th scanning line, at the i-th stage of the odd frame, a voltage value of the valid level signal provided to the (4i−3)-th scanning line is greater than a voltage value of the valid level signal provided to the (4i−2)-th scanning line, and a refresh frequency of the valid level signal provided to the (4i−3)-th scanning line is greater than a refresh frequency of the valid level signal provided to the (4i−2)-th scanning line; and at the i-th stage of the even frame, a voltage value of the valid level signal provided to the (4i−1)-th scanning line is greater than that a voltage value of the valid level signal provided to the 4i-th scanning line, and a refresh frequency of the valid level signal provided to the (4i−1)-th scanning line is greater than a refresh frequency of the valid level signal provided to the 4i-th scanning line.

19. The control method according to claim 15, wherein in a case that the first sub-pixel and the second sub-pixel of pixels in the i-th row are electrically connected to the 2i-th scanning line and the third sub-pixel of the pixels in the i-th row is electrically connected to the (2i−1)-th scanning line, at the i-th stage of the odd frame, a voltage value of the valid level signal provided to the (4i−3)-th scanning line is smaller than a voltage value of the valid level signal provided to the (4i−2)-th scanning line, and a refresh frequency of the valid level signal provided to the (4i−3)-th scanning line is smaller than a refresh frequency of the valid level signal provided to the (4i−2)-th scanning line; and at the i-th stage of the even frame, a voltage value of the valid level signal provided to the (4i−1)-th scanning line is smaller than that a voltage value of the valid level signal provided to the 4i-th scanning line, and a refresh frequency of the valid level signal provided to the (4i−1)-th scanning line is smaller than a refresh frequency of the valid level signal provided to the 4i-th scanning line.

* * * * *